United States Patent
Ueno

(10) Patent No.: US 7,541,955 B2
(45) Date of Patent: Jun. 2, 2009

(54) A/D CONVERSION CIRCUIT AND OPTICAL DISK DRIVE

(75) Inventor: Keishi Ueno, Iruma (JP)

(73) Assignee: TEAC Corporation, Tama-shi (JP)

( * ) Notice: Subject to any disclaimer, the term of this patent is extended or adjusted under 35 U.S.C. 154(b) by 0 days.

(21) Appl. No.: 11/859,632

(22) Filed: Sep. 21, 2007

(65) Prior Publication Data

US 2008/0074301 A1   Mar. 27, 2008

(30) Foreign Application Priority Data

Sep. 26, 2006  (JP) ............................. 2006-261234
Sep. 26, 2006  (JP) ............................. 2006-261235
Oct. 3, 2006   (JP) ............................. 2006-271747

(51) Int. Cl.
    *H03M 1/12* (2006.01)
(52) U.S. Cl. ..................... 341/132; 369/59.17; 341/155
(58) Field of Classification Search ................ 341/118, 341/120, 132, 155; 369/59.17, 59.18, 59.21, 369/59.22
    See application file for complete search history.

(56) References Cited

U.S. PATENT DOCUMENTS

| 4,110,745 A | * | 8/1978 | Ninomiya | .................. | 341/156 |
| 5,592,456 A | * | 1/1997 | Miyashita et al. | ........ | 369/59.18 |
| 5,673,046 A | * | 9/1997 | Hirajima et al. | ............. | 341/159 |
| 6,693,863 B2 | * | 2/2004 | Shoji et al. | ................ | 369/59.22 |
| 7,102,978 B2 | * | 9/2006 | Ogihara | .................... | 369/59.17 |
| 7,369,625 B2 | * | 5/2008 | Kim et al. | ................. | 369/59.18 |
| 2002/0085472 A1 | * | 7/2002 | Mashimo | .................. | 369/59.17 |
| 2004/0042366 A1 | * | 3/2004 | Wada | ....................... | 369/59.17 |

FOREIGN PATENT DOCUMENTS

JP          8-83403 A       3/1996
JP          2002-279736 A   9/2002

* cited by examiner

*Primary Examiner*—Howard Williams
(74) *Attorney, Agent, or Firm*—Christensen O'Connor Johnson Kindness PLLC

(57) ABSTRACT

An A/D conversion circuit converts an asymmetric analogue signal into a digital signal. In an A/D conversion circuit of a parallel type, a central value of a reference voltage is adjusted by means of an average of an input analogue signal, such as a reproduced RF signal from an optical disk, or the like. The average value of the input analogue signal is detected by means of a low-pass filter (LPF). Respective comparators compare the input analogue signal with the reference voltage, and encodes a result of comparison by means of an encoder. An A/D conversion characteristic determined by voltage values from a maximum value Vref1 to an average value and another A/D conversion characteristic determined by voltage values from the average value to a minimum value Vref2 become nonlinear, thereby becoming able to address asymmetry of the input analogue signal.

20 Claims, 13 Drawing Sheets

| INPUT | OUTPUT |
|---|---|
| 10 | 0 |
| 11 | 2 |
| 12 | 5 |
| 13 | 8 |
| ⋮ | ⋮ |
| ⋮ | ⋮ |
| 28 | 3F |
| 29 | 42 |
| ⋮ | ⋮ |
| ⋮ | ⋮ |
| 3D | 78 |
| 3E | 7A |
| 3F | 7D |
| 40 | 80 |
| 41 | 80 |
| 42 | 80 |
| 43 | 81 |
| ⋮ | ⋮ |
| ⋮ | ⋮ |
| 98 | BF |
| 99 | C0 |
| ⋮ | ⋮ |
| ⋮ | ⋮ |
| ED | FD |
| EE | FE |
| EF | FE |
| F0 | FF |

Fig. 16

| INPUT | OUTPUT |
|---|---|
| 10 | 0 |
| 11 | 4 |
| 12 | A |
| 13 | F |
| ⋮ | ⋮ |
| ⋮ | ⋮ |
| 28 | 55 |
| 29 | 57 |
| ⋮ | ⋮ |
| ⋮ | ⋮ |
| 3D | 7D |
| 3E | 7F |
| 3F | 80 |
| 40 | 82 |
| 41 | 83 |
| 42 | 84 |
| 43 | 86 |
| ⋮ | ⋮ |
| ⋮ | ⋮ |
| 98 | D3 |
| 99 | D4 |
| ⋮ | ⋮ |
| ⋮ | ⋮ |
| ED | FD |
| EE | FE |
| EF | FE |
| F0 | FE |

Fig. 17

A/D CONVERSION CIRCUIT AND OPTICAL DISK DRIVE

PRIORITY INFORMATION

This application claims priority to Japanese Patent Application Nos. 2006-261234 and 2006-261235 both filed on Sep. 26, 2006, and No. 2006-271747 filed on Oct. 3, 2006, which are incorporated herein by reference in its entireties.

BACKGROUND

1. Technical Field

The present invention relates to an A/D conversion circuit and an optical disk drive, and more particularly to a correction on asymmetry or vertical asymmetry of an input analogue signal.

2. Related Art

In a next-generation optical disk, such as an HD DVD or a BD (Blu-ray disc), a reproduced signal undergoes intersymbol interference from preceding and subsequent pits because of a relationship between pits in the disk and the diameter of a laser spot. Performing reproducing operation in accordance with a PRML (Partial Response Maximum Likelihood) scheme by active utilization of interference at the time of reproduction of a signal has hitherto been proposed. PRML is a signal processing scheme for reading data exhibiting the highest likelihood from a reproduced signal on the premise that interference exists between a preceding pit and a subsequent pit. The signal processing scheme is a combined technique including a PR detection technique for recording and reproducing data in a narrow frequency band, in an unmodified manner, without suppressing waveform interference and an ML decoding technique for decoding a bit string exhibiting the highest likelihood among a plurality of reproduced signal strings rather than making a determination on a per-bit basis.

A PR class of an HD DVD is determined to be PR [1, 2, 2, 2, 1] from a transmission characteristic achieved between a medium and a pickup. However, a modulation code of the shortest inversion 2T (T is a reference time length) is adopted, and there is a problem of the amplitude of a 2T signal being not acquired at PR [1, 2, 2, 2, 1]. A direct slicing method is usually used as a method for performing playback of an optical disk. When a pit length is 2T, a signal amplitude is small as mentioned above, and hence difficulty is encountered in extracting a 2T signal under the direct slicing method. Under the PRML method, a target signal having a time transition closest to a time transient of a reproduced signal is selected, and a bit string generating the target signal is output as a decoding result. The target signal is computed by means of convolution of a designated impulse response (a PR class) and a bit string. Consequently, an appropriate PR class corresponding to the recording density of the optical disk is selected. Provided that the PR class is expressed as PR[a, b], PR[1, 1] represents a characteristic of an impulse response appearing at two consecutive points of identification at a 1:1 ratio. Therefore, a response output for an input {0 . . 1 . . . } comes to {0 . . 1 1 . . . }. Moreover, PR[1, 2, 1] shows a characteristic of an impulse response appearing at three consecutive points of identification at a 1:2:1 ratio. Consequently, a response output for an input {0 . . 1 . . . } comes to {0 . . 1 2 1 . . . }. In the case of HD DVD, the PR class is expressed as PR[1, 2, 2, 2, 1] which shows that an impulse response appears at five consecutive points of identification at a 1:2:2:2:1 ratio.

However, under the PRML method, a vertically-symmetric reproduced signal can be decoded with high accuracy. However, the method is very unstable for a vertically-asymmetric reproduced signal and may sometimes adversely affect the signal.

JP 2002-279736 A describes detection of the degree of asymmetry of a signal, when the degree of asymmetry is large, binarization is performed through use of a slicer. When the degree of asymmetry is small, binarization is performed through use of a PRML.

JP 8-83403 A describes an adjustment circuit—which adjusts a center voltage level of a reference voltage—being provided to a flash-type A/D conversion circuit used in a channel for reproducing data of PRML scheme.

However, according to the technique disclosed in the related art, since a slicer performs binarization in the case of a reproduced signal exhibiting a large degree of asymmetry, difficulty is encountered in decoding a 2T signal. Thus, an essential resolution has not yet been achieved.

SUMMARY

Accordingly, the present invention is intended to provide an A/D conversion circuit and an optical disk drive which enable performance of appropriate binarization even when a vertically-asymmetrical signal is input.

The present invention provides an A/D conversion circuit comprising:

a comparator for comparing an input analogue signal with a reference voltage; and an adjustment circuit which detects an average value of levels of the input analogue signal, to thus adjust a center level of the reference voltage.

The A/D conversion circuit of the present invention can be of any one of a parallel type, an interpolation type, a pipeline type, a cascade type, a subranging type, and a folding type.

Moreover, the A/D conversion circuit of the present invention can be incorporated into an optical disk drive which records or reproduces data in or from an optical disk. The optical disk drive converts a reproduced RF signal read from the optical disk into a digital signal by means of the A/D conversion circuit, to thus demodulate the signal.

The present invention also provides an A/D conversion circuit comprising:

a comparator for comparing an input analogue signal with a reference voltage;

a detection circuit for detecting a peak value, a bottom value, and an average value of the input analogue signal; and an adjustment circuit for setting a reference voltage according to the peak value, the bottom value, and the average value such that a so-called A/D conversion characteristic is achieved.

Further, the present invention provides an A/D conversion circuit for converting an input analogue signal into a digital signal, comprising:

a first conversion circuit for converting the input analogue signal into a first digital signal;

a detection circuit for detecting a peak value, a bottom value, and an average value of the input analogue signal; and a second conversion circuit for converting the first digital signal into a second digital signal by use of a conversion relationship which is set, according to the peak value, the bottom value, and the average value, in such a way that a desired A/D conversion characteristic is achieved.

According to the present invention, a nonlinear A/D characteristic can be realized with a simple configuration. Hence, a vertically-asymmetrical or asymmetrical reproduced RF signal can be appropriate converted into a digital signal by use of such an A/D conversion circuit.

The invention will be more clearly comprehended by reference to the embodiments provided below. However, the embodiments are merely illustrative, and the scope of the invention is not limited to the embodiments.

BRIEF DESCRIPTION OF THE DRAWINGS

Preferred embodiments of the present invention will be described in detail by reference to the following drawings, wherein:

FIG. 16 is a table for describing the conversion table;

FIG. 17 is a table for describing another conversion table; and

DETAILED DESCRIPTION

Figure 1:
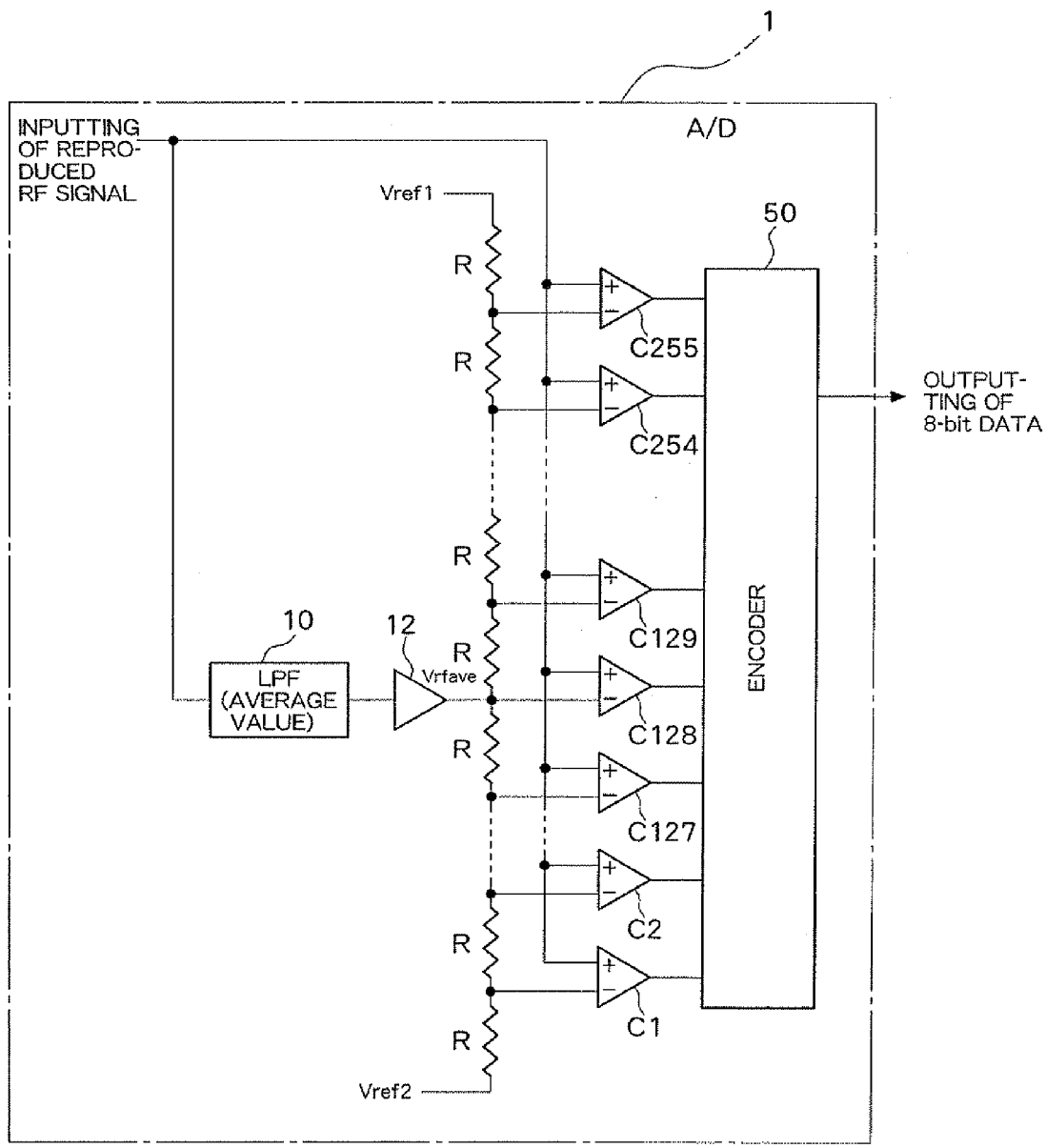
FIG. 1 is a block diagram of an A/D conversion circuit of an embodiment.

Embodiments of the present invention will be described hereunder by reference to the drawing.

First Embodiment

FIG. 1 shows the configuration of an A/D conversion circuit 1 employed in an optical disk drive which performs playback of a next-generation optical disk, such as a HD DVD or a BD (Blu-ray Disc). A reproduced RF signal read from an optical disk by means of an optical pickup of the optical disk drive is equalized by means of an equalizer; subjected to analogue-to-digital conversion by the A/D conversion circuit 1; and decoded by means of PRML processing in a PRML processing section. In a related-art optical disk drive, an A/D conversion circuit exhibits a linear A/D conversion characteristic. However, the A/D conversion circuit 1 shown in FIG. 1 exhibits a non-linear characteristic for solving asymmetry of an input RF signal.

For the sake of comparison, a related-art A/D conversion circuit exhibiting a linear conversion characteristic will first be described prior to description of the A/D conversion circuit shown in FIG. 1.

Figure 6:
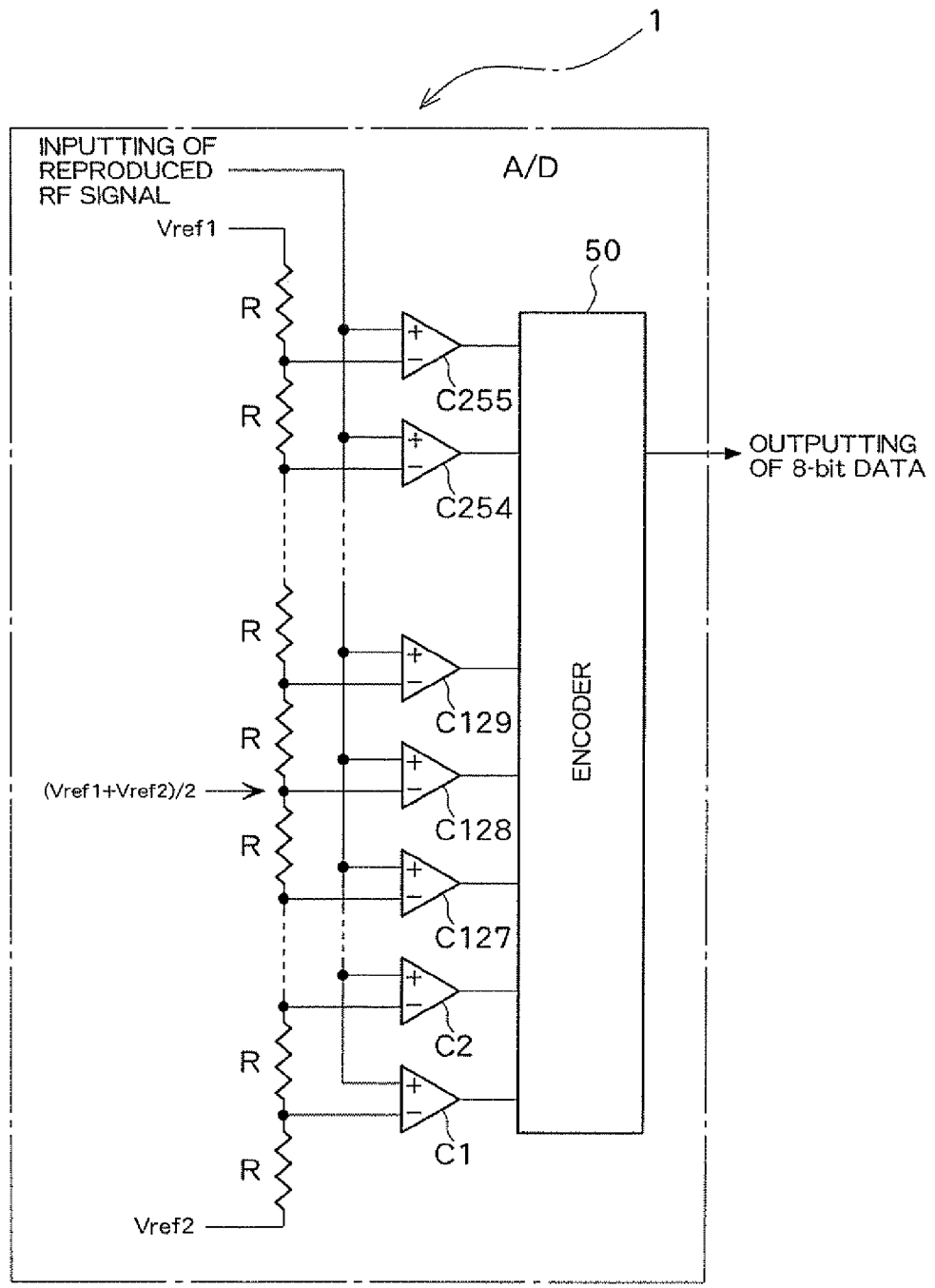
FIG. 6 is a block diagram of a related-art A/D conversion circuit.

FIG. 6 shows the related-art A/D conversion circuit 1 which converts a reproduced RF signal into an 8-bit digital signal. The A/D conversion circuit 1 has comparators C1 to C255 which are supplied with the reproduced RF signal. The reproduced RF signal is supplied to noninverted input terminals (+) of the respective comparators C1 to C255. A reference voltage is supplied to inverted input terminals (−) of the respective comparators C1 to C255. The reference voltage is determined by means of supplying an maximum voltage Vref1 and a minimum voltage Vref 2 to both terminals of respective plural reference resistors R and equally dividing the voltages. The comparators C1 to C255 compare the reproduced RF signal with the equally-divided reference voltage and output comparison results to an encoder 50. The encoder 50 encodes outputs from the respective comparators C1 to C255 and outputs a result of encoding as 8-bit data.

In the meantime, in contrast with the A/D conversion circuit 1 shown in FIG. 6, the A/D conversion circuit 1 shown in FIG. 1 adjusts a central value of the reference voltage by means of a low-pass filter (LPF) 10 and an amplifier 12. The LPF 10 extracts an average voltage Vrfave of the reproduced RF signal and takes the thus-extracted average voltage as a central value of the reference voltage. This average value Vrfave is fed as the reference voltage to an inverted input terminal of a comparator C128 located midway between the comparator C1 and the comparator C255. In the meantime, the comparators C1 to C127 are supplied with, as a reference voltage, an electric voltage determined by means of equally dividing a voltage difference between the average voltage Vrfave and the minimum voltage Vref2. Further, the comparators C129 to C255 are supplied with, as a reference voltage, an electric voltage determined by means of equally dividing a voltage difference between the maximum Vref1 and the average voltage Vrfave. Thus, the comparators C1 to C255 are supplied with the different reference voltages. For these reasons, a resultant A/D conversion characteristic of the A/D conversion circuit 1 becomes nonlinear. Even when reproduced RF signal is a vertically-asymmetrical signal, the average voltage Vrefave fluctuates correspondingly, to thus change the A/D conversion characteristic. Therefore, a digital signal whose asymmetry has been corrected can be output, whereby the accuracy of reading of data from an optical disk is enhanced.

Figure 2:
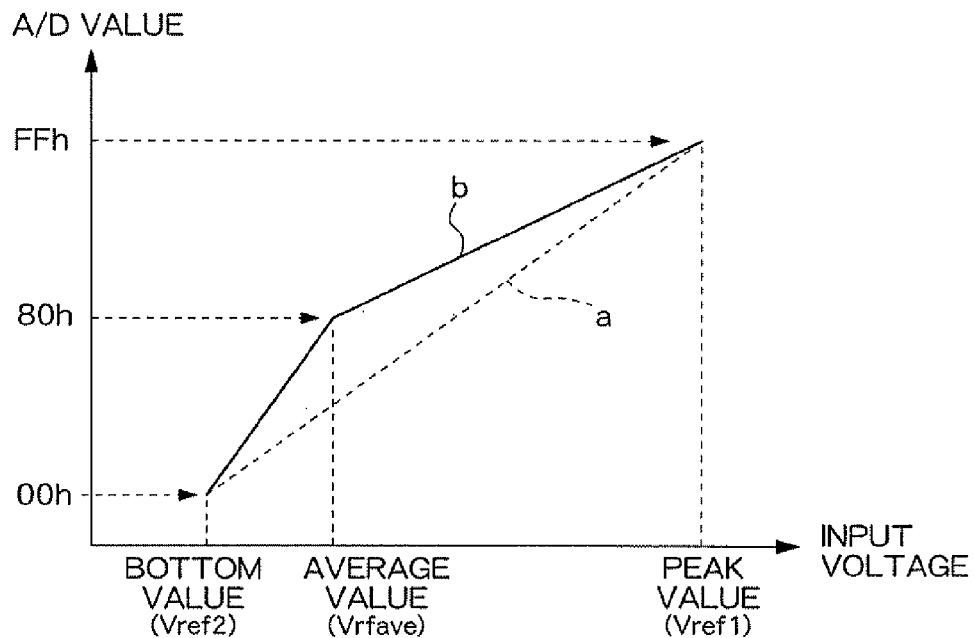
FIG. 2 is a plot of an A/D characteristic of the A/D conversion circuit of the embodiment.

FIG. 2 shows a relationship between an input voltage and an output A/D value. Characteristic "a" belongs to the related-art A/D conversion circuit 1 exhibiting a linear characteristic, and characteristic "b" belongs to the A/D conversion circuit 1 of the present embodiment. In the present embodiment, the average voltage Vrfave is imparted as the central value of the reference voltages, and hence a characteristic (an inclination) achieved between the reference voltage Vref2 and the reference voltage Vrfave differ from a characteristic (an inclination) achieved between the reference voltage Vrfave and the reference voltage Vref1.

Figure 3:
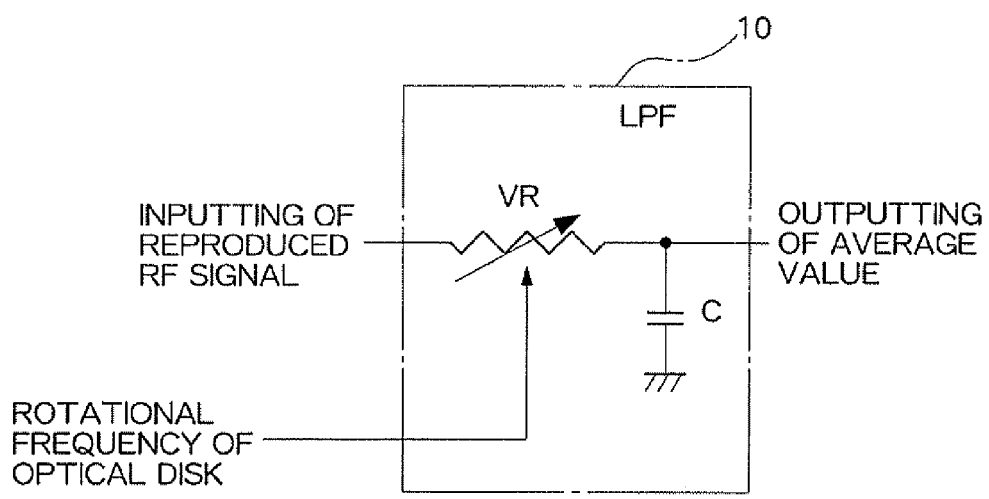
FIG. 3 is a block diagram of a low-pass filter.

FIG. 3 shows the configuration of an LPF 10. A general LPF is formed from a fixed resistor and a capacitor. The LPF 10 of the present embodiment is formed from a variable resistor VR and a capacitor. The value of the variable resistor VR is set in accordance with the rotational frequency of the optical disk. An average value of the reproduced RF signal shows the degree of asymmetry, but the variable frequency of asymmetry fluctuates in accordance with the rotational frequency of the optical disk. In general, as the rotational frequency of the optical disk increases, the variable frequency of asymmetry increases. Accordingly, the value of the variable resistor VR is set in accordance with the rotational frequency of the optical disk, whereby the average value can be extracted reliably.

In the present embodiment, the LPF is used for extracting the average value Vrfave of the reproduced signal. However, an arbitrary circuit for detecting an average value; for example, a smoothing filer, or the like, can be used.

Second Embodiment

Figure 4:
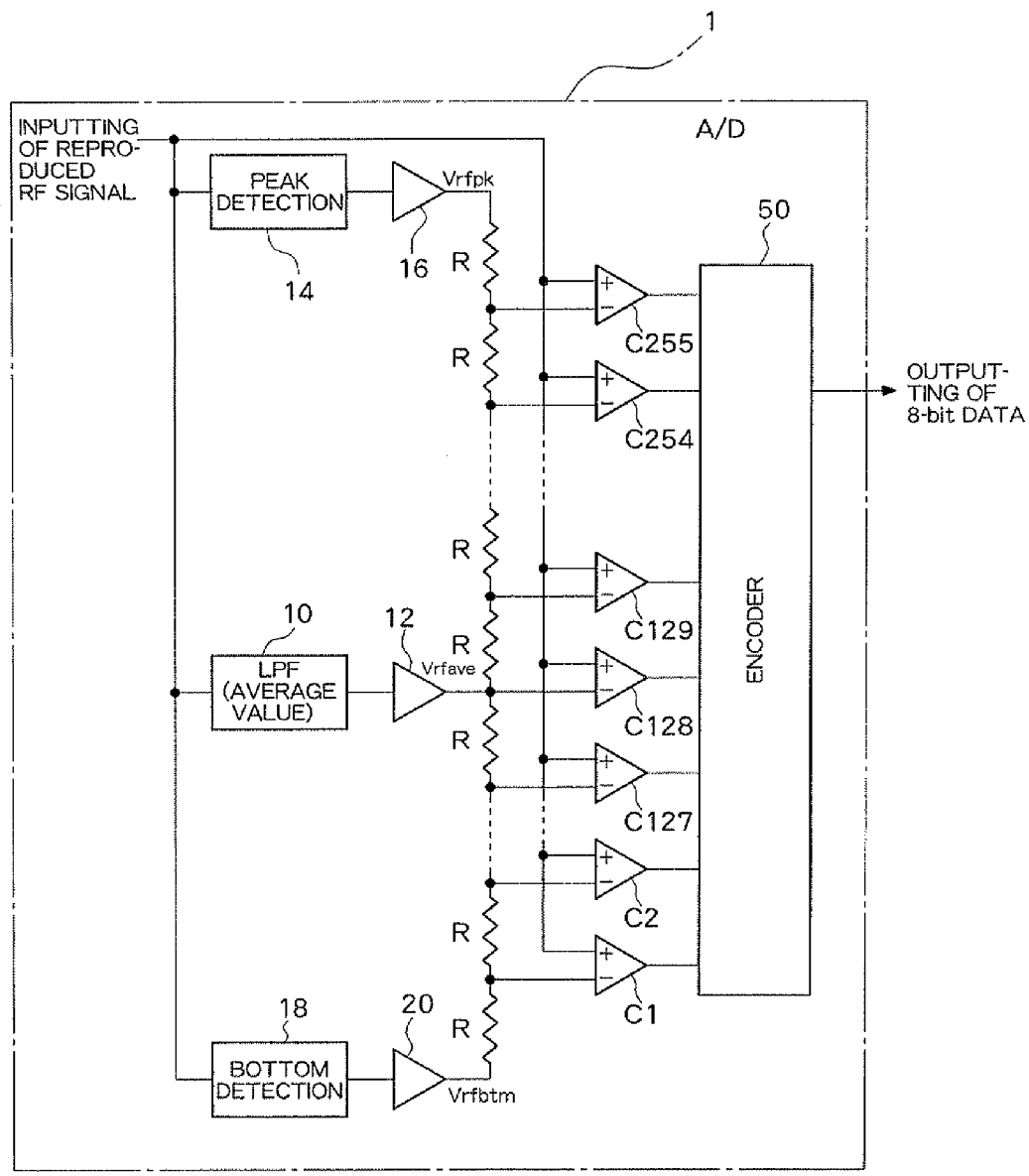
FIG. 4 is a block diagram of an A/D conversion circuit of another embodiment.

FIG. 4 shows the configuration of the A/D conversion circuit 1 of the present embodiment. In addition to including the configuration of FIG. 1, the A/D conversion circuit 1 further includes a peak detection circuit 14 and an amplifier 16 for detecting a peak value of the reproduced RF signal and a bottom detection circuit 18 and an amplifier 20 for detecting a bottom value of the reproduced RF signal. In FIG. 1, a peak value Vrfpk of the reproduced signal RF employed in place of the predetermined maximum voltage Vref 1 and a bottom value Vrfbtm of the reproduced signal RF employed in place of the predetermined minimum voltage Vref 2 are imparted to both ends of the respective plural resistors R.

Even in such a configuration, the central value of the reference voltage is adjusted to the average value of the reproduced RF signal by means of the LPF 10, and hence a nonlinear A/D conversion characteristic is achieved. The characteristic achieved by the configuration shown in FIG. 4 corresponds to one achieved on the assumption that in FIG. 2 the peak value is taken as Vrfpk and the bottom value is taken as Vrfbtm.

Third Embodiment

Although the first and second embodiments have illustrated the A/D conversion circuit of a parallel type, an A/D conversion circuit of a cascade type is described in connection with the present embodiment.

Figure 5:
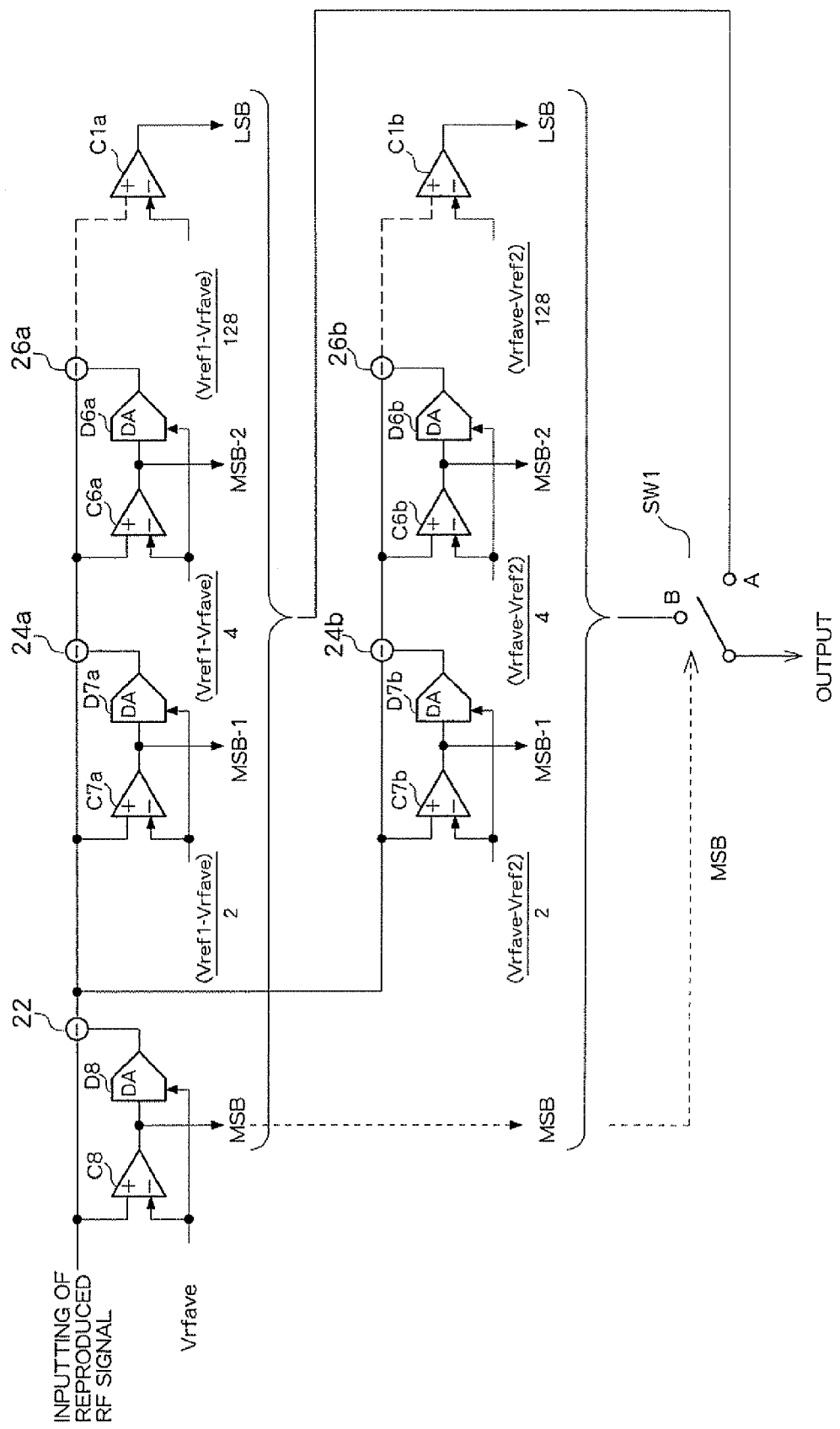
FIG. 5 is a block diagram of an A/D conversion circuit of yet another embodiment.

FIG. 5 shows a block diagram of the A/D conversion circuit 1 of the present embodiment. The A/D conversion circuit 1 is formed from a plurality of stages. Each of the stages is formed from a comparator and a D/A converter. A first stage for outputting the most significant bit (MSB) is formed from a comparator C8 and a D/A converter 8. The reproduced RF signal is supplied to the noninverted input terminal (+) of the comparator C8, and an average value Vrfave of the reproduced RF signal is supplied to the inverted input terminal (−) of the comparator C8. The average value of the reproduced RF signal is detected by means of: e.g., an LPF. The comparator C8 compares the reproduced RF signal with the average value Vrfave, and outputs a comparison result as an MSB value. Further, the comparator C8 outputs the comparison result to the D/A converter D8. The D/A converter D8 converts a digital value of the comparison result into an analogue signal, and outputs the analogue signal to a subtracter 22. The subtracter 22 subtracts the analogue signal produced by the D/A converter D8 from the original reproduced RF signal, and outputs a result of subtraction to the second stage and subsequent stages. The signal supplied to the second stage and the subsequent stages corresponds to a result of (the reproduced RF signal−Vrfave).

In the meantime, the second stage and the subsequent stages are formed from two channels. A first channel takes, as a reference for comparison, a voltage difference Vref1−Vrfave between the predetermined maximum voltage Vref1 and the average voltage Vrfave. A second channel takes, as a reference for comparison, a voltage difference Vrfave−Vref2 between the average voltage Vrfave and the predetermined minimum voltage Vref2. One of the two channels is alternatively selected.

First, the first channel will be described. The second stage is formed from a comparator C7a and a D/A converter D7a. A signal of the reproduced RF signal−Vrfave, is supplied to a noninverted input terminal of the comparator C7a, and a signal of (Vref1−Vrefave)/2 is supplied to a noninverted input terminal of the comparator C7. The comparator C7a compares these signals with each other, and outputs a comparison result as a bit value of MSB−1 that is lower in order than the MSB by one. The D/A converter D7a converts the digital value into an analogue signal, and outputs the signal to a subtracter 24a. The subtracter 24a supplies {the reproduced RF signal−Vrfave−(Vref1−Vrfave)/2} to the next stage. The third stage is formed from a comparator C6a and a D/A converter D6a. A signal of {the reproduced RF signal−Vrfave−(Vref1−Vrfave)/2} is supplied to a noninverted input terminal of the comparator C6a, and a signal of (Vref1−Vrfave)/4 is supplied to an inverted input terminal of the comparator C6a. The comparator C6a compares these signals with each other, and outputs a comparison result as a bit value of MSB−2 that is lower in order than the MSB by two. The D/A converter D6a converts the digital value into an analogue signal, and outputs the analogue signal to the subtracter 26a. The subtracter 26a supplies the next stage with a signal of {the reproduced RF signal−Vrfave−(Vref1−Vrfave)/2−(Vref1−Vrfave)/4}. Likewise, processing is carried out up to the seventh stage. A result of processing performed in the seventh stage is supplied to the comparator C1a of the final stage. The comparator C1a compares the input signal with a signal of (Vref1−Vrfave)/128 that is a reference voltage, and outputs a result of comparison as an LSB (least significant bit) value.

Next will be descried the second channel. The second stage is formed from a comparator C7b and a D/A converter D7b. A signal of the reproduced RF signal−Vrfave is supplied to a noninverted input terminal of the comparator C7b, and a signal of (Vrfave−Vref2)/2 is supplied to an inverted input terminal of the comparator C7b. The comparator C7b compares these signals with each other, and outputs a result of comparison as a bit value MSB−1 which is lower in order than the MSB by one. Moreover, the D/A converter D7b converts a digital value into an analogue value, and outputs the analogue value to the subtracter 24b. The subtracter 24b supplies a signal of {reproduced RF signal−Vrfave−(Vrfave−Vref2)/2} to the next stage. The third sate is formed from a comparator C6b and a D/A converter D6b. The signal of {reproduced RF signal−Vrfave−(Vrfave−Vref2)/2} is fed to a noninverted input terminal of the comparator C6b, and a signal of (Vrfave−Vref2)/4 is fed to an inverted input terminal of the comparator C6b. The comparator C6b compares these signals with each other, and outputs a result of comparison as a bit value MSB−2 that is lower in order than the MSB by two. Moreover, the D/A converter 6b converts a digital value into an analogue value, and outputs the analogue value to the subtractor 26b. The subtractor 26b supplies a signal of {reproduced RF signal−Vrfave−(Vrfave−Vref2)/2−(Vrfave−Vref2)/4} to the next stage. Likewise, processing is carried out up to the seventh stage. A result of processing performed in the seventh stage is supplied to a comparator C1b in the final stage. The comparator C1b compares the input signal with (Vrfave−Vref2)/128 that is a reference voltage, and outputs a result of comparison as an LSB (least significant bit).

Bit values of MSB−1 to LSB from the first channel are supplied to a terminal A of a switch SW1, and bit values MSB−1 to LSB from the second channel are supplied to a terminal B of the switch SW1. A terminal of the switch SW1 is switchably controlled according to the value of the MSB. When the MSB assumes a value of one; that is, when the level of the reproduced RF signal is greater than the average Vrfave, the terminal is switched to the terminal A, whereupon the bit values MSB−1 to LSB from the first channel are output. When the MSB assumes a value of zero; namely, when the level of the reproduced RF signal is smaller than the average value Vrfave, the terminal is switched to the terminal B, whereupon the bit values MSB−1 to LSB from the second channel are output. 8-bit data—which are a combination of the bit values MSB−1 to LSB with the bit value MSB—are output. In the first channel, the reference voltage determined by equally dividing the reference voltages Vref1 to Vrfave is compared by the comparator, and a result of comparison is digitized. In the second channel, the reference voltage determined by equally dividing the reference voltages Vrfave to Vref2 is compared by the comparator, and a result of comparison is digitized. Consequently, even in the present embodiment, the reference voltages are digitized by means of the A/D conversion characteristics that differ from each other with reference to the average value Vrfave, whereby a nonlinear characteristic is acquired. A characteristic of the present embodiment is identical with that shown in FIG. 2. By means of such a nonlinear A/D characteristic, asymmetry of the reproduced RF signal can be corrected, and the accuracy of reading of data from the optical disk is enhanced.

Although the reference voltages Vref1 and Vref2 are used in the present embodiment, the peak value of the reproduced RF signal may also be used in place of Vref1, and the bottom value of the reproduced RF signal may also be used in place of the reference voltage Vref2.

Although the above embodiments have described the A/D conversion circuit of a parallel type and the A/D conversion circuit of a cascade type, the present invention can also be applied, in the same manner, to an A/D conversion circuit of another type; for example, an A/D conversion circuit of an interpolation type, an A/D conversion circuit of a pipeline type, an A/D conversion circuit of a subranging type, or an A/D conversion type of a folding type. The A/D conversion circuit of an interpolation type is a modification of the A/D conversion circuit of a parallel type. Pre-amplifiers which are smaller in number than the comparators are provided in a stage prior to the comparators, and a resistor string for interpolating a voltage is connected between outputs of the adjacent pre-amplifiers. A tap voltage of the resistor string is supplied to the comparators. A voltage determined by equally dividing the reference voltage difference is usually imparted to the pre-amplifiers. However, as in the case of the circuit shown in FIG. 1, the essential requirement is to detect the average voltage of the reproduced RF signal and to supply the thus-detected average voltage as the central value of the reference voltage to the pre-amplifiers. Moreover, an A/D conversion circuit of a pipeline type sequentially subjects bits from the MSB to the LSB to A/D conversion on a per-bit basis. Specifically, in the first stage the bit values are subjected to A/D conversion in the first stage, to thus first determine the MSB. A quantization error in the MSB is subjected to A/D conversion in the next stage, thereby determining the second bit. Similar processing is iterated, to thus determine bit values up to the LSB. A sample hold circuit is interposed between steps or stages. As in the case of the circuit shown in FIG. 5, the essential requirement is to detect an average voltage of the reproduced RF signal and to supply the detected voltage to a comparator and a D/A converter in each stage. In the case of an A/D conversion circuit of a subranging type or a folding type, the conversion circuit of a parallel type is provided in a number of two. One conversion circuit is caused to take charge of A/D conversion of high-order bits, and the other conversion circuit is caused to take charge of A/D conversion of low-order bits. Thus, A/D conversion is performed in two stages.

Figure 7:
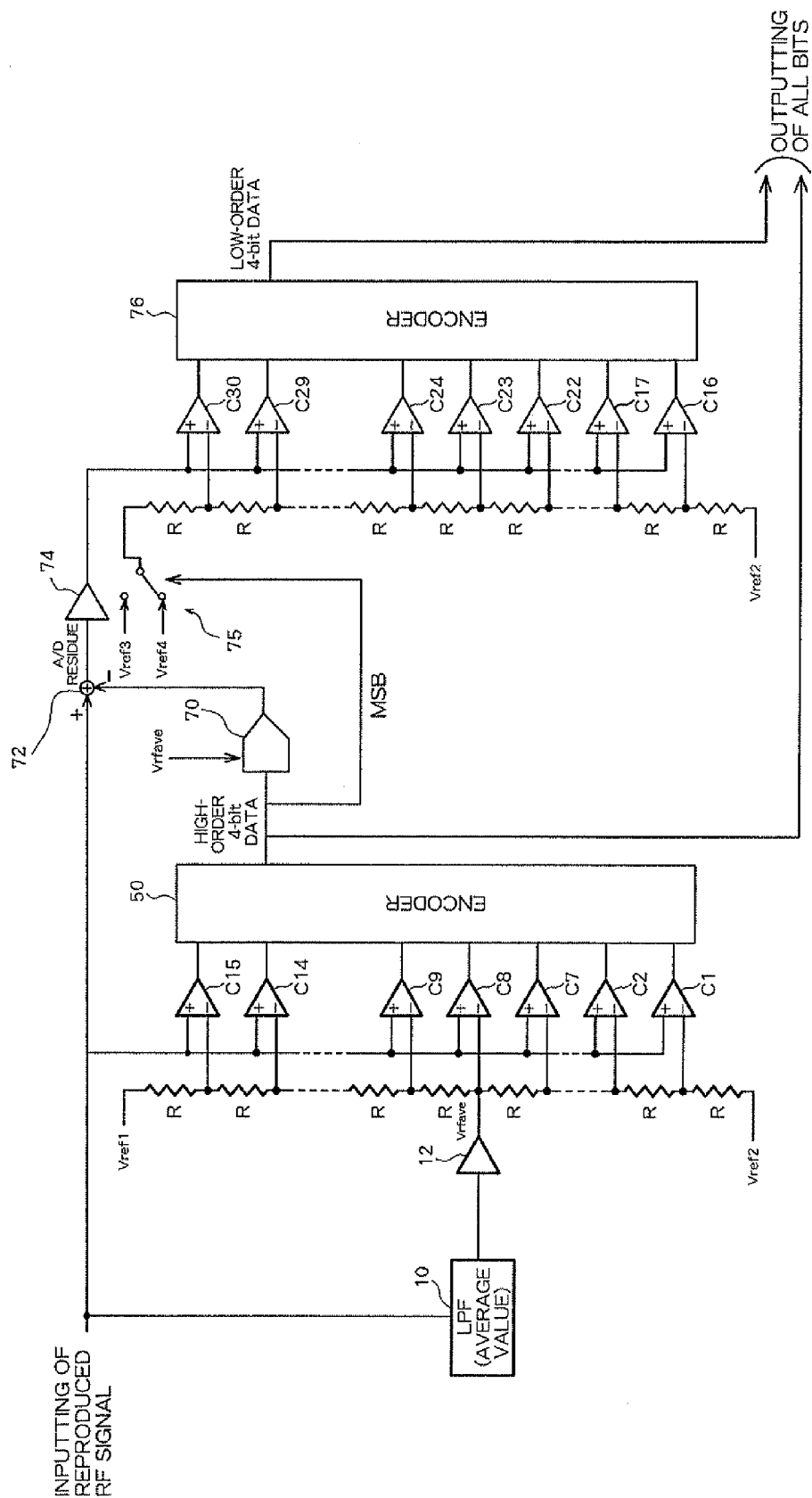
FIG. 7 is a block diagram of an A/D conversion circuit of still another embodiment.
Figure 8:
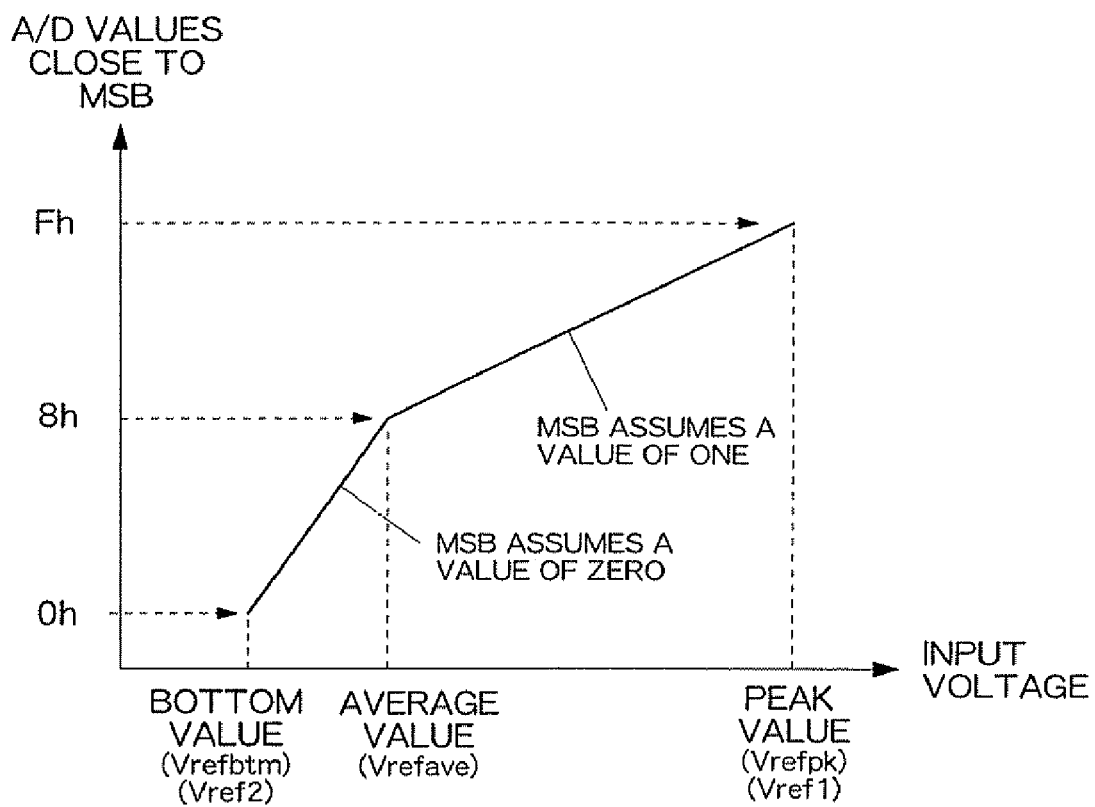
FIG. 8 is a plot of an A/D conversion characteristic achieved by the configuration shown in FIG. 7.

FIG. 7 shows an 8-bit A/D conversion circuit of a subranging type. The A/D conversion circuit of a subranging type first subjects high-order bits to A/D conversion and subsequently subjects residual low-order bits to A/D conversion. A comparator reference voltage used for subjecting the high-order bits to A/D conversion is given as the average value of the reproduced RF signal as in the case of the circuit shown in FIG. 1. A converted result of the high-order bits is subjected to D/A conversion in a D/A converter 70, and a differential device 72 subtracts the thus-converted result from an analogue signal, to thus determine a residue corresponding to the low-order bits. The D/A converter 70 is configured to have a nonlinear characteristic according to the reference voltage Vrfave for generating an analogue value from a digital value obtained as a result of A/D conversion of nonlinear high-order bits of the previous stage. When the high-order bits are four bits, the dynamic range of the residue has already come to one-sixteenths of an input. Hence, it is preferable to have multiplied the dynamic range in advance by a factor of 16 through use of an amplifier 74. As shown in FIG. 8, the A/D conversion characteristic of the low-order bits is changed by means of the MSB. Namely, the MSB is supplied to a switch 75, and the reference voltage is changed according to the value of the MSB. The reference voltage Vref3 is selected when the MSB assumes a value of zero, and the reference voltage Vref4 is selected when the MSB assumes a value of one. Now, the reference voltages are defined as follows:

Vref3=Vrfave

*Vref4=Vref2+(Vref1−Vrfave)*.

Subsequently, comparators C16 to C30 compare the residual analogue signal with the respective reference voltages, and comparison results are encoded by an encoder 76, to thus output low-order bits. The high-order bits supplied from the encoder 50 and the low-order bits from the encoder 76 are output in combination as a result of A/D conversion. It is preferable to change the value of the reference voltage Vref3 and the value of the reference voltage Vref4 according to a gain A of an amplifier 74. The same also applies to an A/D converter of a folding type.

Fourth Embodiment

Figure 9:
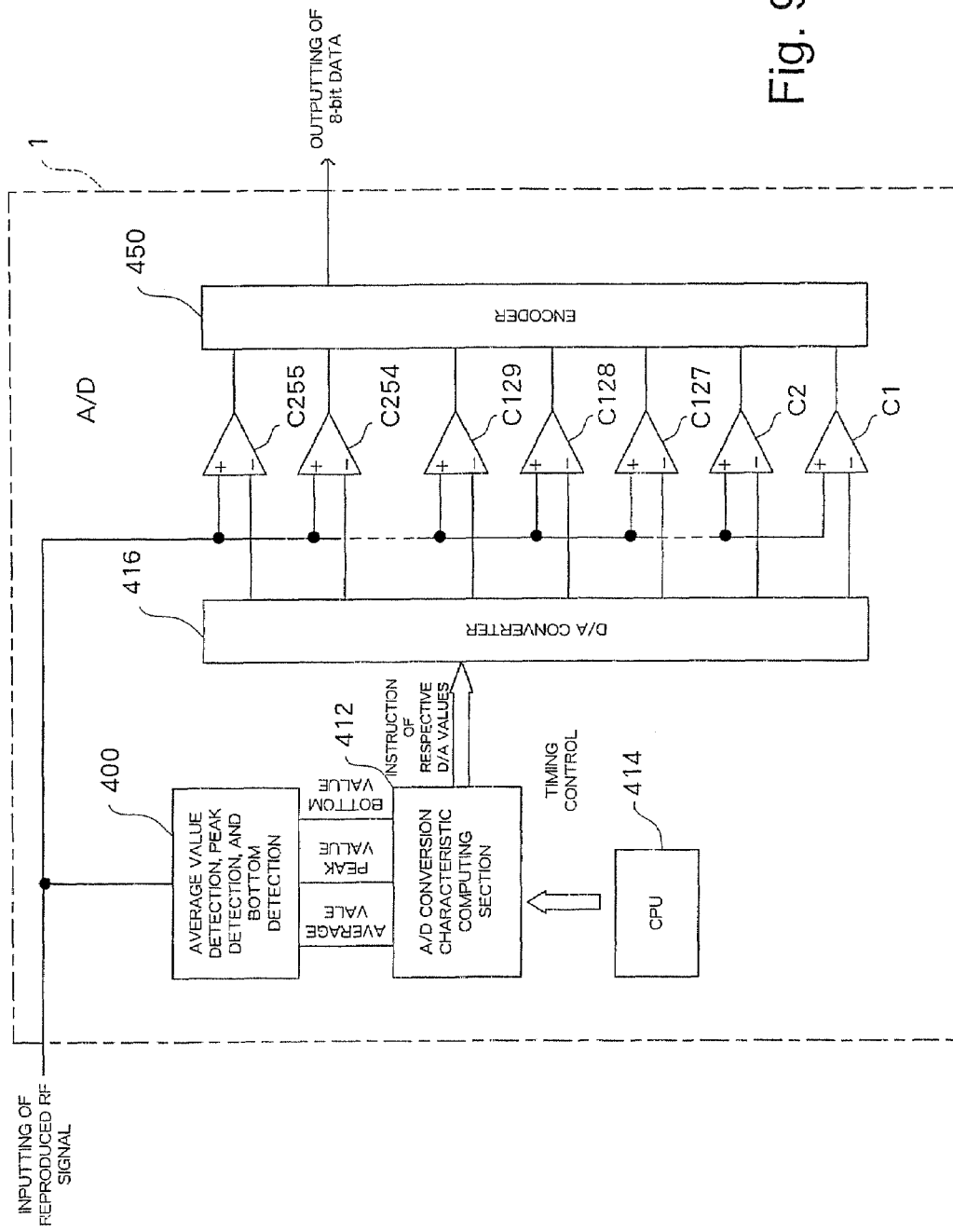
FIG. 9 is a block diagram of an A/D conversion circuit of yet another embodiment.

FIG. 9 shows the configuration of the A/D conversion circuit 1 of a fourth embodiment. A reproduced RF signal read from an optical disk by means of an optical pickup of an optical disk drive is equalized by an equalizer and is subjected to A/D conversion in the A/D conversion circuit 1. The thus-converted signal undergoes PRML processing in a PRML processing section, to thus become decoded. In the related-art optical disk drive, the A/D conversion circuit exhibits a linear A/D conversion characteristic. However, the A/D conversion circuit 1 shown in FIG. 9 exhibits a nonlinear characteristic in order to solve the asymmetry of the input RF signal.

The A/D conversion circuit 1 shown in FIG. 9 differs from the counterpart circuits of the other embodiments in terms of a method for setting a reference voltage imparted to the respective comparators C1 to C255. Specifically, the A/D conversion circuit has an adjustment circuit which sets a reference voltage so as to acquire a desired A/D conversion characteristic rather than equally dividing the reference voltage by means of the plurality of resistors R.

The adjustment circuit includes a detection circuit 400, an A/D conversion characteristic computing circuit 412; a CPU 414; and a D/A converter 416. The detection circuit 400 detects a peak value Vrfpk, a bottom value Vrfbtm, and an average value Vrfave of the reproduced RF signal, supplying the thus-detected values to the A/D conversion characteristic computing section 412. The A/D conversion characteristic computing section 412 computes a desired A/D conversion characteristic from the peak value Vrefpk, the bottom value Vrfbtm, and the average value Vrfave. The desired A/D conversion characteristic is a conversion characteristic which is nonlinear in relation to the level of the input analogue signal. For instance, in a two-dimensional coordinate plane achieved by setting the peak value Vrefpk to a digital value FFh; setting the bottom value Vrfbtm to a digital value 00h; setting the average value Vrfave to a digital value 80h; setting the horizontal axis to an input voltage; and setting the vertical axis to a digital value, two points (Vrfbtm, 00h) and (Vrfave, 80h) are connected together by means of a straight line, and two points (Vrfave, 80h) and (Vrfpk, FFh) are connected together by means of another straight line, whereby settings are made such that a nonlinear characteristic is entirely exhibited. The CPU 414 controls the timing of the A/D conversion characteristic computing section 412. The A/D conversion characteristic computing section 412 may also be formed from the CPU 414.

Figure 10:
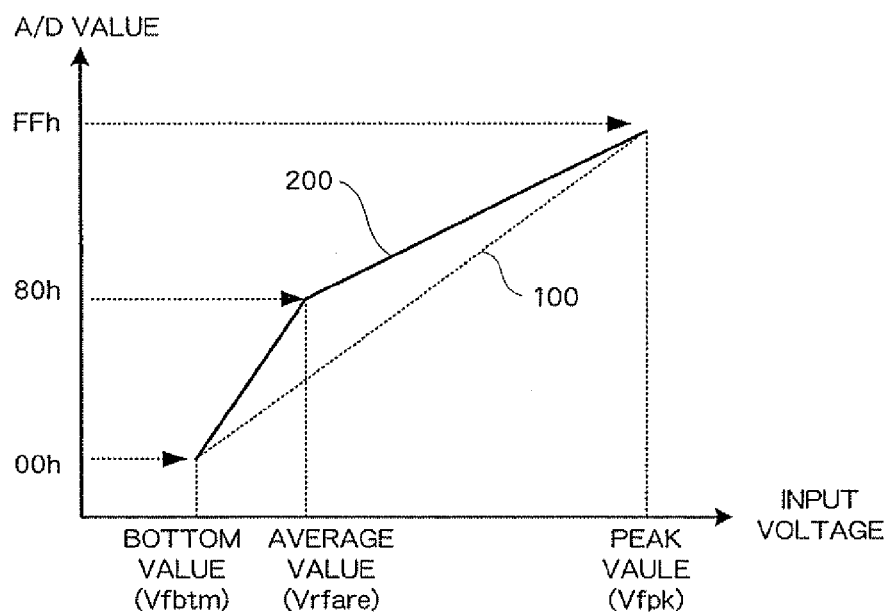
FIG. 10 is a plot of a desired A/D conversion characteristic.

FIG. 10 shows an A/D conversion characteristic. The horizontal axis represents an input voltage, and the vertical axis represents a digital value achieved after A/D conversion. The related-art A/D conversion circuit provides the respective comparators with a voltage determined by means of equally dividing a potential difference between the maximum voltage Vref1 and the minimum voltage Vref2 by means of the resistor R. Therefore, the minimum voltage Vref2 (corresponding to the bottom value) is taken as 00h and that the maximum value Vref1 (corresponding to the peak value) is taken as FFh, there is achieved a linear characteristic 100 that linearly connects the minimum value to the maximum value. In contrast, in the present embodiment, the bottom value and the average value are connected together by means of a straight line, and the average value and the peak value are connected together by means of a straight line. Hence, a nonlinear characteristic 200 is achieved.

Figure 11:
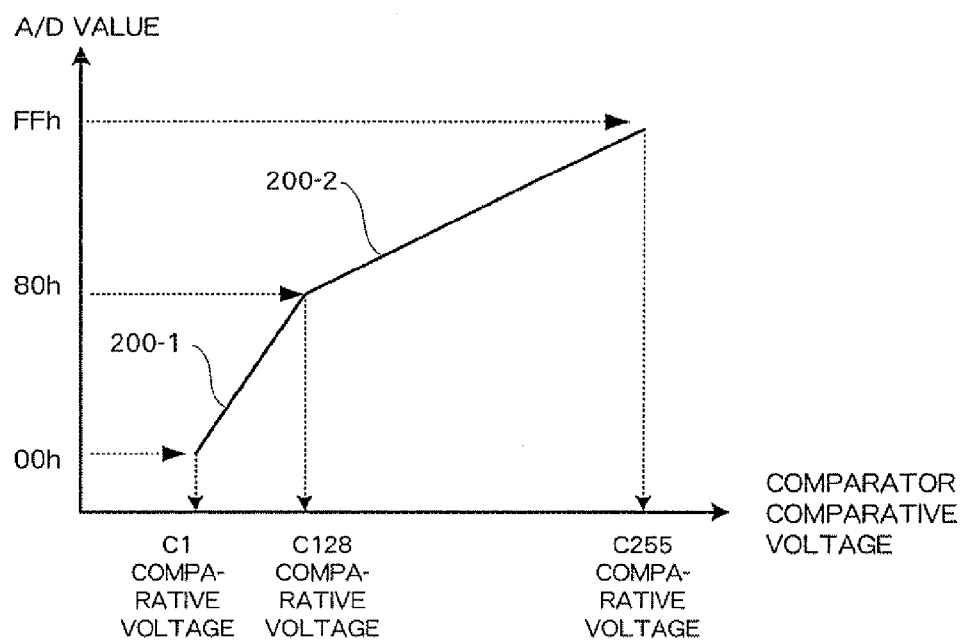
FIG. 11 is a plot of a characteristic of a D/A converter for achieving a desired A/D conversion characteristic.

FIG. 11 shows a method for setting a reference voltage to be imparted to the respective comparators C1 to C255 in such a way that a nonlinear characteristic 200 shown in FIG. 10 is achieved. The reference voltage is acquired as a result of the D/A converter 416 converting a digital value provided by the A/D conversion characteristic computing section 412 into an analogue voltage in accordance with a desired A/D conversion characteristic set by the A/D conversion characteristic computing section 412. In FIG. 11, the horizontal axis represents a reference voltage generated by the D/A converter 416, and the vertical axis represents a digital value. Digital values from 00h to 80h are converted into analogue voltages according to the characteristic indicated by a straight line 200-1, and the analogue voltages are supplied to the respective comparators. For instance, a voltage obtained by subjecting the digital value 00h to D/A conversion is supplied to the comparator C1. A voltage obtained by subjecting a digital value 80h to D/A conversion is supplied to an intermediate comparator C128. Moreover, digital values from 80h to FFh are converted into analogue voltages according to a characteristic indicated by a straight line 200-2 which differs from the straight line 200-1 in terms of an inclination. The analogue signals are supplied to the respective comparators. As a result of comparison between FIGS. 10 and 11, an average voltage of the reproduced RF signal is fed to the intermediate comparator C128 as a reference voltage at all times. According to the related-art A/D conversion characteristic, the average voltage of the reproduced RF signal is converted into another digital value (a value which is smaller than 80h). However, in the present embodiment, the average voltage of the reproduced RF signal is understood to be converted into an intermediate value (80h) of the full-scale A/D conversion at all times. Thus, as a result of the reference voltage being set such that a desired A/D conversion characteristic is achieved, the reproduced RF signal is converted into a digital signal by means of a nonlinear A/D conversion characteristic. Equal resolution of A/D conversion can be imparted to a signal which is higher than the average of the reproduced RF signal as well as to a signal which is lower than the average of the reproduced RF signal. In the present embodiment, a result of A/D conversion of the average of the reproduced RF signal assumes an intermediate value of the full-scale A/D conversion at all times as mentioned above, and the asymmetry of the reproduced RF signal is corrected effectively.

The detection circuit 400 of the present embodiment is formed from a peak detection circuit, a bottom detection circuit, and an average value detection circuit. Setting a time constant of the respective circuits to sufficiently a small value so as to eliminate noise from the band of the reproduced RF signal is desirable. For instance, the time constant is set to a frequency band essentially equal to the rotational frequency (in the case of a standard speed of a DVD, the time constant is set to a frequency band of about 20 Hz the inner radius of a disk and to a frequency band of about 10 Hz at the outer radius of the disk). Moreover, the average value detection circuit can be formed from; e.g., a low-pass filter. However, the average value detection circuit is comprised of a variable resistor VR and a capacitor, and a value of the variable resistor VR is set in accordance with the rotational frequency of an optical disk. Although the average of the reproduced RF signal shows the degree of asymmetry, a fluctuating frequency of asymmetry fluctuates according to the rotational frequency of the optical disk. In general, the greater the rotational frequency of the optical disk, the greater the fluctuating frequency of asymmetry. Accordingly, the value of the variable resistor VR is set according to the rotational frequency of the optical disk, whereby an average value can be extracted without fail.

In the present embodiment, the A/D conversion characteristic computing section 412 determines a desired A/D conversion characteristic; namely, a characteristic for determining asymmetry of the reproduced RF signal. However, asymmetry is induced by a change in recording conditions, and the amount of asymmetry also changes. For example, asymmetry changes according to variations in recording power induced by a temperature, variations in recording sensitivity achieved in a plane, variations in sensitivity achieved in respective layers of a multilayer disk, and a difference in recording sensitivity attributable to spherical aberration. Therefore, a desired A/D conversion characteristic is not stationary and may also be dynamically changed according to asymmetry. In order to change a desired A/D conversion characteristic pursuant to a change in asymmetry, the following methods are available.

(1) A peak value, a bottom value, and an average value of the reproduced RF signal achieved at a point of initiation of playback are detected at the time of commencement of rotation of an optical disk or playback operation, thereby acquiring an A/D conversion characteristic optimum for asymmetry. Subsequently, the quality of reproduction of data; for example, an error rate, is measured while data are being reproduced. When an error rate has become deteriorated and exceeded a given level, the peak value, the bottom value, and the average value of the reproduced RF signal are detected again. An A/D conversion characteristic optimum for correction of asymmetry is acquired again.

(2) An optical disk is divided into a plurality of areas (e.g., an inner radius area, an intermediate radius area, and an outer radius area in each layer) at the time of commencement of rotation of an optical disk or playback operation. A peak value, a bottom value, and an average value of the reproduced RF signal are detected in each of the areas, whereby an A/D conversion characteristic optimum for correction of asymmetry is acquired. In subsequent steps, during playback operation, playback is performed by means of the A/D conversion characteristic acquired according to a playback area. When the area has changed to another area, playback is performed by means of switching the current A/D conversion characteristic to an A/D conversion characteristic for that area.

(3) The foregoing methods (1) and (2) are used in combination. Specifically, A/D conversion characteristics optimum for the respective areas are acquired, and an A/D conversion characteristic appropriate for a playback area is used at the time of playback operation. In the meantime, when an error rate has exceeded a given level, the A/D conversion characteristics is again acquired.

In the present embodiment, there is adopted, as a desired A/D conversion characteristic, a characteristic which is determined by means of connecting three points (the bottom value of the RF signal: 00h), (the average value of the RF signal: 80h), and (the peak value of the RF signal: FFh)=(an input voltage, a digital value) by means of straight lines. However, an approximating curve passing through the three points may also be computed, to thus determine a desired A/D conversion characteristic. The approximating curve is; for example, a quadratic curve, but an arbitrary approximating curve can also be used.

Figure 12:
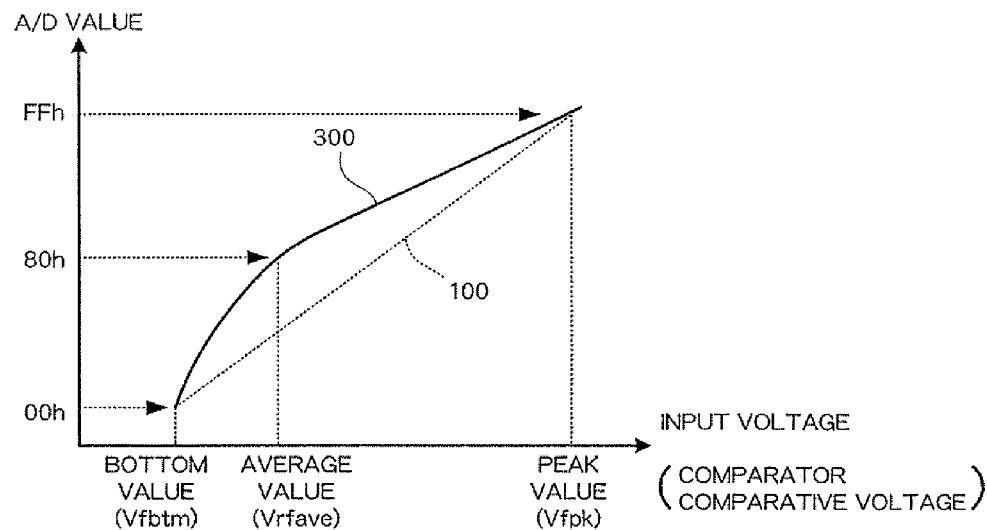
FIG. 12 is a plot of a desired A/D conversion characteristic.

FIG. 12 shows a desired A/D conversion characteristic 300 acquired by approximating three points through use of a quadratic curve. For comparison purpose, the related-art linear A/D conversion characteristic 100 is also shown. The A/D conversion characteristic computing section 412 computes a peak value, a bottom value, and an average value from a characteristic 300 and provides the characteristic 300 to the D/A converter 416.

Moreover, the present embodiment has been described by means of taking the A/D conversion circuit of a parallel type as an example. The present embodiment can also be applied to an A/D conversion circuit of another type; for example, an A/D conversion circuit of a cascade type, an A/D conversion circuit of an interpolation type, an A/D conversion circuit of a pipeline type, an A/D conversion circuit of a subranging type, and an A/D conversion circuit of a folding type. The A/D conversion circuit of interpolation type is a modification of the A/D conversion circuit of a parallel type. Preamplifiers which are smaller in number than the comparators are provided at a stage prior to the comparators. A resistor string for interpolating a voltage is connected between the output terminals of the adjacent preamplifiers, and a tap voltage of the resistor string is supplied to the comparators. Although a voltage determined by equally dividing a reference voltage difference is usually imparted to the preamplifiers, the essential requirement is to detect a peak value, a bottom value, and an average of the reproduced RF signal in the same manner as in the circuit shown in FIG. 9, to cause the A/D conversion characteristic computing section 412 to compute a desired A/D conversion characteristic, to provide the D/A converter 416 with the computed A/D conversion characteristic, and to supply the preamplifiers with the reference voltage for the D/A conversion. The A/D conversion circuit of a pipeline type or an A/D conversion circuit of a cascade type sequentially performs A/D conversion of bits from the MSB to the LSB on a per-bit basis. Specifically, A/D conversion is performed in the first stage, to thus determine the MSB. A quantization error in the MSB is subjected to A/D conversion in the next stage, to thus determine the second bit. Similar processing is iterated, thereby determining bits up to the LSB. The essential requirement is to supply the reference voltage from the D/A converter 416 to the comparator and the D/A converter in each stage in such a way that a desired A/D conversion characteristic is achieved. In the case of an A/D conversion circuit of a subranging type or a folding type, an A/D conversion circuit of a parallel type is provided in a number of two. One conversion circuit is caused to take charge of A/D conversion of high-order bits, and the other conversion circuit is caused to take charge of A/D conversion of low-order bits. The D/A converter 416 imparts a reference voltage to a high-order bit stage and a low-order bit stage in such a way that a desired A/D conversion characteristic is achieved.

Figure 13:
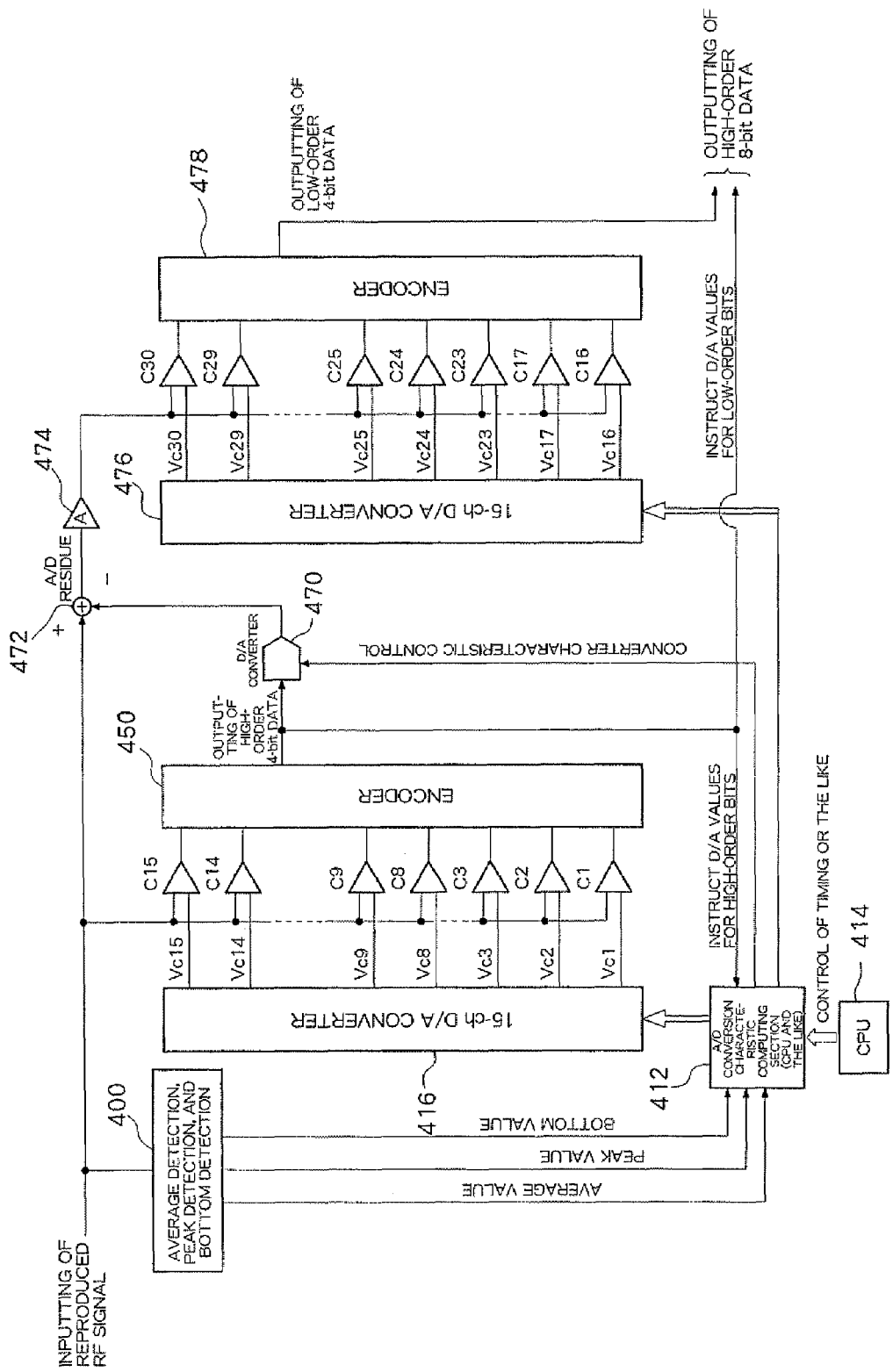
FIG. 13 is a block diagram of an A/D conversion circuit of still another embodiment.

FIG. 13 shows an 8-bit A/D conversion circuit of a subranging type. The A/D conversion circuit of a subranging type first subjects high-order bits to A/D conversion and subsequently subjects residual low-order bits to A/D conversion. As in the case of the circuit shown in FIG. 9, a peak value, a bottom value, and an average value of the reproduced RF signal are detected by means of a detection circuit 400, and the thus-detected values are subjected to computation performed by the A/D conversion characteristic computing section 412. A result of computation is supplied from the D/A converter 416 as a comparator reference voltage for subjecting the high-order bits to A/D conversion. The D/A converter 416 is a 15-channel converter which outputs reference voltages Vc1 to Vc15 and imparts the reference voltages to the respective comparators C1 to C15. The A/D conversion characteristic computing section 412 computes the comparator reference voltages VC16 to Vc30 for low-order four bits by reference to the high-order four bits acquired from the comparator reference voltages Vc1 to Vc15, and supplies the thus-computed comparator reference voltages to the D/A converter 476. In the meantime, the result of high-order four bits is subjected to D/A conversion in a D/A converter 470 having a conversion characteristic analogous to that used for A/D conversion of the high-order four bits, and a differential device 472 subtracts the result of D/A conversion from the reproduced RF signal, to thus determine a residue. This residue is supplied to the respective comparators C16 to C30 as an input for A/D conversion of low-order four bits. Since the dynamic range of the residue has already come to about one-sixteenths of the dynamic range of the original reproduced RF signal. Hence, it is preferable to have multiplied the dynamic range in advance by a factor of 16 through use of an amplifier 474 and to supply the respective comparators C16 to C30 with the residue. The D/A converter 476 is also a 15-channel D/A converter as is the D/A converter 416. Comparator reference voltages Vc16 to Vc30 are generated by means of the characteristic determined by the A/D conversion characteristic computing section 412, and the thus-generated voltages are supplied to the respective comparators C16 to C30. The respective comparators C16 to C30 compare the residue with the respective reference voltages, and results of comparison are encoded by means of an encoder 478, thereby outputting low-order four bits. A total of eight bits resulting from combination of the high-order four bits from the encoder 450 with the low-order four bits from the encoder 478 are output. In FIG. 13, the A/D conversion characteristic computing section 412 controls a characteristic of the D/A converter 470 and instructs a D/A characteristic of the D/A converter 416 and a D/A characteristic of the D/A converter 476. However, these characteristics are relevant to each other, and hence embodying these D/A converters in the form of a single CPU is preferable.

Fifth Embodiment

Figure 14:
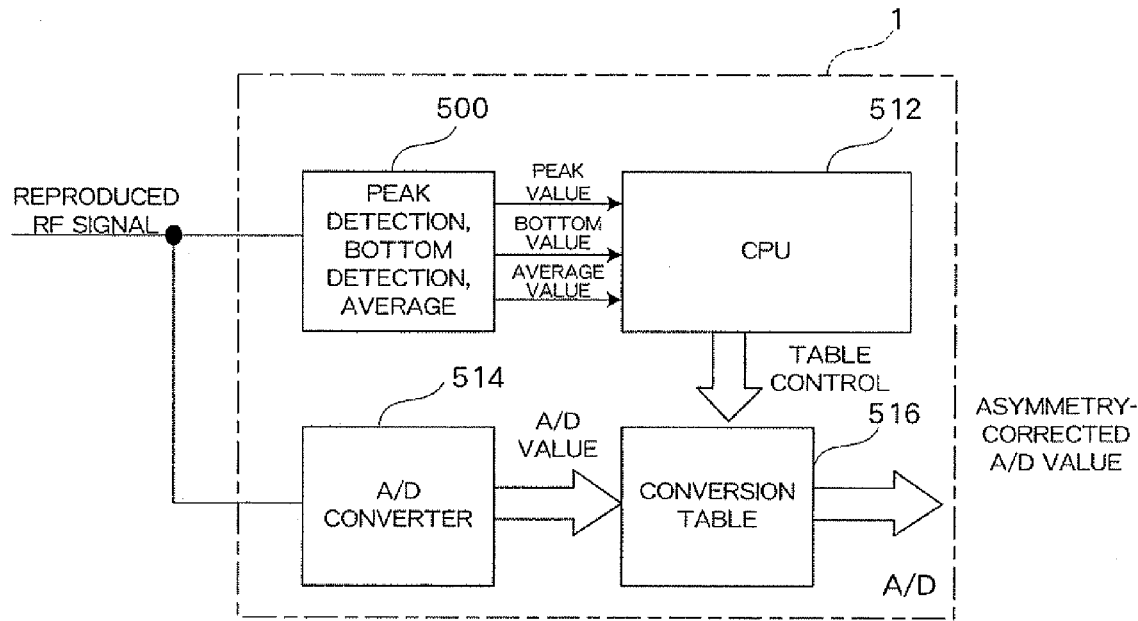
FIG. 14 is a block diagram of an A/D conversion circuit of yet another embodiment.

FIG. 14 shows the configuration of the A/D conversion circuit 1 of the present embodiment. A reproduced RF signal read from an optical disk by means of an optical pickup of an optical disk drive is equalized by the equalizer. The thus-equalized signal is subjected to A/D conversion in the A/D conversion circuit 1, and a result of conversion is supplied as a digital signal whose asymmetry has been corrected to the PRML processing section, where the signal undergoes PRML processing, to thus be decoded.

The A/D conversion circuit 1 in FIG. 14 includes a related-art A/D conversion circuit as an A/D converter 514. The A/D conversion circuit additionally has a CPU 512 and a conversion table 516 as a second conversion circuit for converting an output from the A/D converter 514 into a digital value. Moreover, the A/D conversion circuit 1 also has a detection circuit 500 for detecting a peak value, a bottom value, and an average value of the reproduced RF signal. A peak value, a bottom value, and an average value of the reproduced RF signal detected by the detection circuit 500 are supplied to a CPU 512. In accordance with these values, the CPU 512 prepares a conversion table 516 in such a way that a desired A/D conversion characteristic is achieved. A digital value (a first digital value) output from the A/D converter 514 is further converted into a second digital value through use of this conversion table 516, and a result of conversion is output as a second digital value. The first digital value is determined linearly with respect to the reproduced RF signal. However, the first digital value and the second digital value are associated with each other in a nonlinear manner by means of a conversion table. Hence, the second digital value is determined nonlinearly with respect to the reproduced RF signal.

A method for preparing the conversion table 516 using the peak value, the bottom value, and the average value of the reproduced RF signal will be described hereunder. The reproduced RF signal is supplied also to a detection circuit 500 as well as to the A/D converter 514 that linearly converts an input analogue signal into a digital as does the related-art conversion circuit. The detection circuit 500 detects a peak value (Vrfpk), a bottom value (Vrfbtm), and an average value (Vrfave) of the reproduced RF signal, and supplies the thus-detected values to the CPU 512.

The higher and lower reference voltages (Vref1 and Vref2) of the A/D converter 514 are known, and A/D-converted digital values (the first digital values) corresponding respectively to the peak value, the bottom value, and the average value of the reproduced RF signal come to specified values. These values are taken as a first digital value acquired after conversion of a peak value=ADpk a first digital value acquired after conversion of a bottom value=ADbtm a first digital value acquired after conversion of an average value=ADave.

For example, the values are assumed to be defined as
ADpk=F0h
ADbtm=10h
ADave=40h.

The CPU 512 generates a conversion table 516 that converts the first digital value to the second digital value, by use of these three digital values. Specifically, the CPU prepares the nonlinear conversion table 516 which converts ADpk into the maximum value FFh of the full-scale conversion; which converts ADbtm into the minimum value 00h of full-scale conversion; and which converts ADave into the intermediate value 80h of full-scale conversion, so as to achieve a desired A/D conversion characteristic. The thus-generated conversion table is stored in memory. Descriptions are provided by reference to the above example. There is prepared a conversion table which converts F0h into FFh; which converts 10h into 00h; and which converts 40h into 80h. For example, the following two methods are available as a specific method for generating a conversion table.

(1) In a two-dimensional coordinate in which the horizontal axis represents a first digital value and in which the vertical axis represents a second digital value, a space between (10h, 00h) and (40h, 80h) is interpolated by means of a straight line, and a space among (40h, 80h) and (F0h, FFh) is interpolated by means of a straight line.

(2) In a two-dimensional coordinate in which the horizontal axis represents the first digital value and in which the vertical axis represents the second digital value, a space among (10h, 00h), (40h, 80h), and (F0h, and FFh) is approximated by means of an approximating curve, to thus become interpolated.

Figure 15:
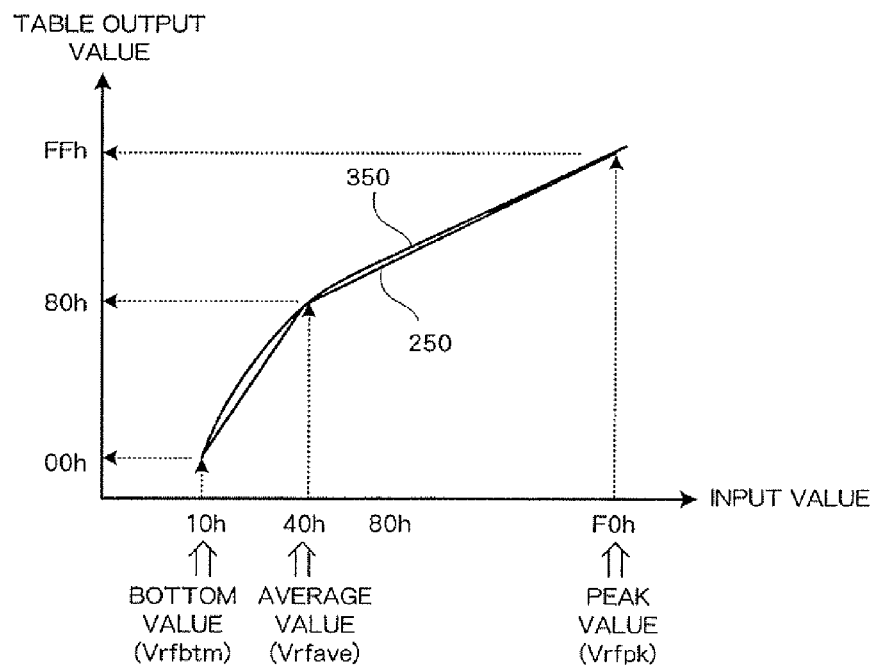
FIG. 15 is a plot of a conversion characteristic of a conversion table.

FIG. 15 shows a conversion characteristic 250 for the case of (1) and a conversion characteristic 350 for the case of (2). A quadratic approximating curve is used for the conversion characteristic 350 for the case of (2). As shown in FIG. 15, the average value 40h is converted into the intermediate value 80h at all times, and the second digital value changes nonlinearly with respect to the first digital value.

FIG. 16 shows a specific conversion table 516 for acquiring the conversion characteristic 250. FIG. 17 shows a specific conversion table 516 for acquiring the conversion characteristic 350. In the drawings, INPUT corresponds to first digital values, and OUTPUT corresponds to second digital values. In FIG. 16, a first digital value 10h is converted into a second digital value 00h (0h in the drawing). A first digital value 11h is converted into a second digital value 02h; a first digital value 40h is converted into a second digital value 80h; and a first digital value 43h is converted into a second digital value 81h; a first digital value EFh is converted into a second digital value FEh; and a first digital value F0 is converted into a second digital value FFh. In FIG. 17, a first digital value 10h is converted into a second digital value 00h. A first digital value 11h is converted into a second digital value 04h; a first digital value 40h is converted into a second digital value 82h; and a first digital value 43h is converted into a second digital value 86h; a first digital value EFh is converted into a second digital value FEh; and a first digital value F0h is converted into a second digital value FEh. In any event, an average value of the reproduced RF signal comes to an intermediate value of the dynamic range of a playback-system digital circuit or at least a neighborhood thereof, whereby asymmetry of a reproduced RF signal is corrected.

In the present embodiment, the detection circuit 500 detects a peak value, a bottom value, and an average value of the reproduced RF signal. A peak value, a bottom value, and an average value can be detected by use of the first digital value output from the A/D converter 514.

Figure 18:
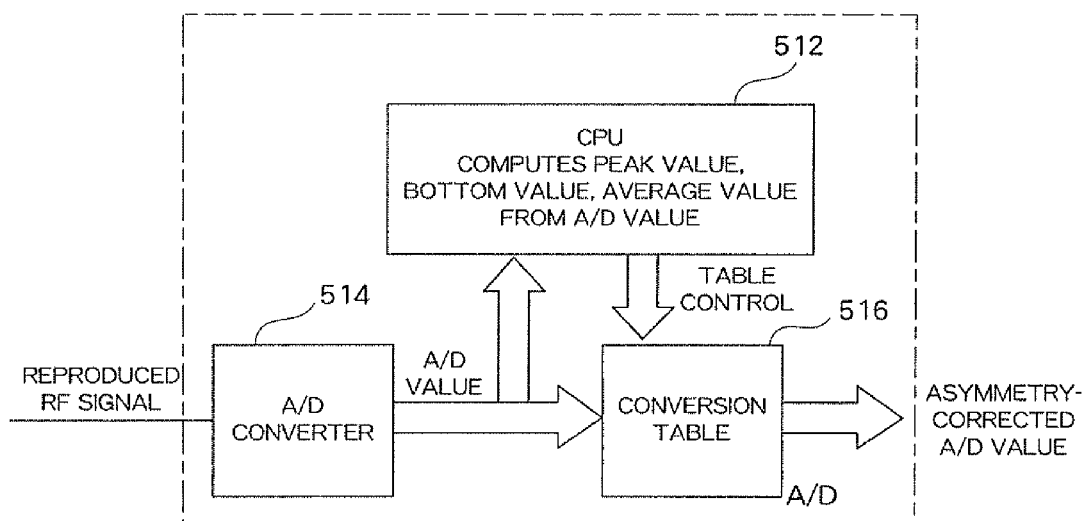
FIG. 18 is a block diagram of an A/D conversion circuit of still another embodiment.

FIG. 18 shows the configuration of the A/D conversion circuit achieved in this case. The detection circuit 500 is not present. The essential requirement for the CPU 512 is supply the first digital value from the A/D converter 514 to the CPU 512; to detect the maximum value of the first digital value acquired during a certain period of time as ADpk, the minimum value of the same acquired during the certain period of time as ADbtm, and an average value of the same acquired during the certain period of time as ADave; and to prepare the conversion table 516 in accordance with the thus-detected ADpk, ADbtm, and ADave.

The detection circuit 500 is comprised of a peak detection circuit, a bottom detection circuit, and an average value detection circuit. Setting a time constant of the respective circuits to a sufficiently small value so as to eliminate noise from the band of the reproduced RF signal is desirable. For instance, there is set a frequency band essentially equal to the rotational frequency (in the case of the standard speed of the DVD, the time constant is set to a frequency band of about 20 Hz at the inner radius of a disk and the time constant is set to a frequency band of about 10 Hz achieved at the outer radius of the disk). Moreover, the average value detection circuit can be formed from; e.g., a low-pass filter. However, the average value detection circuit is comprised of a variable resistor VR and a capacitor, and a value of the variable resistor VR is set in accordance with the rotational frequency of an optical disk. Although the average of the reproduced RF signal shows the degree of asymmetry, a fluctuating frequency of asymmetry fluctuates according to the rotational frequency of the optical disk. In general, the greater the rotational frequency of the optical disk, the greater the fluctuating frequency of asymmetry. Accordingly, the value of the variable resistor VR is set according to the rotational frequency of the optical disk, whereby an average value can be extracted reliably.

Further, asymmetry of the reproduced RF signal appears according to a change in recording conditions, and the amount of change also changes. For example, asymmetry changes according to variations in recording power induced by a temperature, variations in recording sensitivity achieved in a plane, variations in sensitivity achieved in respective layers of a multilayer disk, and a difference in recording sensitivity attributable to spherical aberration. Therefore, a conversion table 1b for achieving a desired A/D conversion characteristic is not fixed but may also be dynamically changed according to asymmetry. In order to change a desired A/D conversion characteristic pursuant to a change in asymmetry, the following methods are available.

(1) A peak value, a bottom value, and an average value of the reproduced RF signal achieved at a time of initiation of playback are detected at the time of commencement of rotation of an optical disk or playback operation, thereby preparing the A/D conversion table 1b optimum for correction of asymmetry. Subsequently, the quality of reproduction of data; for example, an error rate, is measured while data are being reproduced. When an error rate has become deteriorated and exceeded a given level, the peak value, the bottom value, and the average value of the reproduced RF signal are again detected. The A/D conversion table 516 optimum for correction of asymmetry is acquired again.

(2) An optical disk is divided into a plurality of areas (e.g., an inner radius area, an intermediate radius area, and an outer radius area in each layer) at the time of commencement of rotation of an optical disk or playback operation. A peak value, a bottom value, and an average value of the reproduced RF signal are detected in each of the areas, whereby the A/D conversion table 516 optimum for correction of asymmetry is acquired. Subsequently, during playback operation, data reproduction is performed by means of the A/D conversion characteristic acquired according to a playback area. When the area has changed to another area, playback is performed by means of switching the conversion table to another A/D conversion table 516 for that area.

(3) The foregoing methods (1) and (2) are used in combination. Specifically, the optimum conversion table 1b for each area is prepared, and the conversion table 516 appropriate for the playback area is used during reproducing operation. In the meantime, when an error rate has exceeded a given level, the conversion table 516 is prepared again.

Moreover, the present embodiment has been described by means of taking an A/D conversion circuit of a parallel type as an example of the A/D converter 514. The present embodiment can also be applied to an A/D converter of another type; for example, an A/D converter of a cascade type, an A/D converter of an interpolation type, an A/D converter of a pipeline type, an A/D converter of a subranging type, and an A/D converter of a folding type. The A/D converter of an interpolation type is a modification of the A/D converter of a parallel type. Preamplifiers which are smaller in number than the comparators are provided at a stage prior to the comparators. A resistor string for interpolating a voltage is connected between the output terminals of the adjacent preamplifiers, and a tap voltage of the resistor string is supplied to the comparator. The A/D converter of a pipeline type or the A/D converter of a cascade type sequentially performs A/D conversion of bits from the MSB to the LSB on a per-bit basis. Specifically, A/D conversion is performed in the first stage, to thus first determine the MSB. A quantization error in the MSB is subjected to A/D conversion in the next stage, to thus determine the second bit. Similar processing is iterated, thereby determining bits up to the LSB. In the case of an A/D conversion circuit of a subranging type or a folding type, an A/D conversion circuit of a parallel type is provided in number of two. One conversion circuit is caused to take charge of A/D conversion of high-order bits, and the other conversion circuit is caused to take charge of A/D conversion of low-order bits. Even when either of the A/D converters 514 is used, the essential requirement is to convert the first digital value output from the A/D converter according to the conversion table 516, to thus output a second digital value.

What is claimed is:

1. An A/D conversion circuit comprising:
   a comparator for comparing an input analogue signal with a reference voltage;
   one or more comparators of a first channel for comparing the input analogue signal with a first reference voltage;
   one or more comparators of a second channel for comparing the input analogue signal with a second reference voltage; and
   an adjustment circuit which detects an average level of the input analogue signal, to thus adjust a center level of the reference voltage.

2. The A/D conversion circuit according to claim 1, wherein the adjustment circuit includes a low-pass filter, and a cutoff frequency of the low-pass filter is set according to a degree of asymmetry of the input analogue signal.

3. The A/D conversion circuit according to claim 2, wherein the input analogue signal is a reproduced RF signal from an optical disk, and the cutoff frequency of the low-pass filter is set according to a rotational frequency of the optical disk.

4. The A/D conversion circuit according to claim 1, wherein the comparator compares the input analogue signal with the reference voltage in each step of a cascade or a stage; and the A/D conversion circuit further comprises:
   a D/A converter for converting a result of comparison made by the comparator into an analogue signal; and
   a subtractor which subtracts an output from the D/A converter from the input analogue signal and which outputs a result of subtraction to a subsequent stage, wherein the adjustment circuit detects an average level of the input analogue signal, to thus adjust a center level of the reference voltage.

5. The A/D conversion circuit according to claim 4, wherein the comparator in a first step of the cascade or the stage compares the input analogue signal with the average level, and outputs a result of comparison as an MSB;

comparators in a second step and subsequent steps are formed from the comparators of the first channel and comparators of the second channel;

the one or more comparators in respective steps of the first channel perform comparison by use of a reference voltage obtained by splitting a potential difference between the first reference voltage and the average reference voltage, thereby outputting a bit value which is lower in order than the MSB;

the one or more comparators in respective steps of the second channel perform comparisons by use of a reference voltage obtained by splitting a potential difference between the average level and the second reference voltage, thereby outputting a bit value which is lower in order than the MSB; and the A/D conversion circuit further comprises a switch which selectively switches between the first channel and the second channel, thereby producing an output.

6. The A/D conversion circuit according to claim 1, wherein the A/D conversion circuit is of any one of a parallel type, an interpolation type, a pipeline type, a cascade type, a subranging type, and a folding type.

7. An optical disk drive comprising:
the A/D conversion circuit defined in claim 1, wherein an analogue signal read from an optical disk is converted into a digital signal and demodulated.

8. An A/D conversion circuit comprising:
a comparator for comparing an input analogue signal with a reference voltage;
a detection circuit for detecting a first value, a second value, and an average value of the input analogue signal;
one or more comparators for comparing the input analogue signal with the first value;
one or more comparators for comparing the input analogue signal with the second value; and
an adjustment circuit for setting a reference voltage according to the first value, the second value, and the average value such that a so-called A/D conversion characteristic is achieved.

9. The A/D conversion circuit according to claim 8, wherein the desired A/D conversion characteristic is such that the second value is converted into a minimum digital value; that the first value is converted into a maximum digital value; that the average value is converted into an intermediate digital value; that a digital value linearly changes between the second value and the average value in accordance with an input voltage value; and that the digital value linearly changes between the average value and the first value in accordance with an input voltage value.

10. The A/D conversion circuit according to claim 8, wherein the desired A/D conversion characteristic is such that the second value is converted into a minimum digital value; that the first value is converted into a maximum digital value; that the average value is converted into an intermediate digital value; and that a digital value nonlinearly changes, in accordance with an input voltage value, between the second value and the average value and between the average value and the first value.

11. The A/D conversion circuit according to claim 8, wherein the input analogue signal is a reproduced RF signal from an optical disk; and the desired A/D conversion characteristic is updated according to the quality of reproduction of data from the reproduced RF signal.

12. The A/D conversion circuit according to claim 8, wherein the input analogue signal is a reproduced RF signal from an optical disk; and
the desired A/D conversion characteristic is set for each playback area of the optical disk.

13. The A/D conversion circuit according to claim 8, wherein the adjustment circuit includes a D/A conversion circuit, wherein the D/A conversion circuit generates an analogue reference voltage from a digital value such that a desired A/D conversion characteristic is acquired.

14. The A/D conversion circuit according to claim 8, wherein the A/D conversion circuit is of any one of a parallel type, an interpolation type, a pipeline type, a cascade type, a subranging type, and a folding type.

15. An A/D conversion circuit for converting an input analogue signal into a digital signal, comprising:
a first conversion circuit for converting the input analogue signal into a first digital signal;
a detection circuit for detecting a first value, a second value, and an average value of the input analogue signal; and
a second conversion circuit for converting the first digital signal into a second digital signal by use of a conversion relationship which is set, according to the first value, the second value, and the average value, in such a way that a desired A/D conversion characteristic is achieved.

16. The A/D conversion circuit according to claim 15, wherein the desired A/D conversion characteristic is such that the second value is converted into a minimum digital value; that the first value is converted into a maximum digital value; that the average value is converted into an intermediate digital value; that a digital value linearly changes between the second value and the average value in accordance with an input voltage value; and that the digital value linearly changes between the average value and the first value in accordance with an input voltage value.

17. The A/D conversion circuit according to claim 15, wherein the desired A/D conversion characteristic is such that the second value is converted into a minimum digital value; that the first value is converted into a maximum digital value; that the average value is converted into an intermediate digital value; and that a digital value nonlinearly changes, in accordance with an input voltage value, between the second value and the average value and between the average value and the first value.

18. The A/D conversion circuit according to claim 15, wherein the conversion relationship is defined by a conversion table which specifies correspondences between the first digital signal and the second digital signal.

19. The A/D conversion circuit according to claim 15, wherein the input analogue signal is a reproduced RF signal from an optical disk; and
the desired A/D conversion characteristic is updated according to the quality of reproduction of data from the reproduced RF signal.

20. The A/D conversion circuit according to claim 15, wherein the input analogue signal is a reproduced RF signal from an optical disk; and
the desired A/D conversion characteristic is set for each playback area of the optical disk.

* * * * *